(12) United States Patent
Xia et al.

(10) Patent No.: US 12,402,295 B2
(45) Date of Patent: Aug. 26, 2025

(54) METHOD FOR FABRICATING SEMICONDUCTOR DEVICE AND SEMICONDUCTOR DEVICE

(71) Applicant: CHANGXIN MEMORY TECHNOLOGIES, INC., Hefei (CN)

(72) Inventors: Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 450 days.

(21) Appl. No.: 17/974,540

(22) Filed: Oct. 27, 2022

(65) Prior Publication Data

US 2023/0038593 A1 Feb. 9, 2023

(30) Foreign Application Priority Data

Nov. 4, 2021 (CN) .......................... 202111300177.X

(51) Int. Cl.
*H10B 12/00* (2023.01)
*H01L 21/033* (2006.01)
(Continued)

(52) U.S. Cl.
CPC ......... *H10B 12/09* (2023.02); *H01L 21/0334* (2013.01); *H01L 21/0337* (2013.01);
(Continued)

(58) Field of Classification Search
CPC ............... H01L 21/027; H01L 21/0271; H01L 21/0273; H01L 21/0274; H01L 21/0276;
(Continued)

(56) References Cited

U.S. PATENT DOCUMENTS 6,372,572 B1 4/2002 Yu et al.
2002/0127854 A1* 9/2002 Kang ................... H10D 1/716
438/689
(Continued)

FOREIGN PATENT DOCUMENTS

CN 103663357 A 3/2014
CN 110265290 A 9/2019
(Continued)

OTHER PUBLICATIONS

Office action issued in corresponding U.S. Appl. No. 17/04,178 mailed on Mar. 10, 2025, 11 pages.

*Primary Examiner* — Zandra V Smith
*Assistant Examiner* — Molly K Reida
(74) *Attorney, Agent, or Firm* — Kilpatrick Townsend & Stockton LLP

(57) ABSTRACT

Embodiments provide a method for fabricating a semiconductor device and the semiconductor device. The method includes: providing a semiconductor substrate having a first region and a second region; forming an initial mask layer on an upper surface of the substrate; patterning the initial mask layer, forming a first pattern mask having a first height on the first region, and forming a second pattern mask having a second height on the second region, where a pattern density of the first pattern mask is greater than a pattern density of the second pattern mask, and the first height is greater than the second height; and etching the substrate based on the first pattern mask and the second pattern mask, transferring a pattern of the first pattern mask to the first region, and transferring a pattern of the second pattern mask to the second region.

11 Claims, 11 Drawing Sheets

(51) Int. Cl.
 *H10D 1/00* (2025.01)
 *H10D 1/68* (2025.01)

(52) U.S. Cl.
 CPC .......... *H10B 12/03* (2023.02); *H10B 12/033* (2023.02); *H10D 1/042* (2025.01); *H10D 1/68* (2025.01); *H10D 1/716* (2025.01)

(58) Field of Classification Search
 CPC .............. H01L 21/033; H01L 21/0332; H01L 21/0334; H01L 21/0335; H01L 21/0337; H10B 12/03; H10B 12/033; H10B 12/09
 See application file for complete search history.

(56) References Cited

U.S. PATENT DOCUMENTS

| | | | | |
|---|---|---|---|---|
| 2011/0012237 | A1* | 1/2011 | Pierrat | ............... H01L 21/0337 |
| | | | | 716/55 |
| 2017/0069633 | A1* | 3/2017 | Kim | .................... H10B 12/315 |
| 2018/0182636 | A1 | 6/2018 | Prasad et al. | |
| 2021/0375625 | A1 | 12/2021 | Cho et al. | |

FOREIGN PATENT DOCUMENTS

| | | |
|---|---|---|
| JP | 2007335660 A | 12/2007 |
| KR | 20060010927 A | 2/2006 |

\* cited by examiner

METHOD FOR FABRICATING SEMICONDUCTOR DEVICE AND SEMICONDUCTOR DEVICE

CROSS REFERENCE TO RELATED APPLICATION

This application claims priority to Chinese Patent Application No. 202111300177.X, titled "METHOD FOR FABRICATING SEMICONDUCTOR DEVICE AND SEMICONDUCTOR DEVICE" and filed to the State Patent Intellectual Property Office on Nov. 4, 2021, the entire contents of which are incorporated herein by reference.

TECHNICAL FIELD

The present disclosure relates to the field of integrated circuit and electronic component fabrication technology, and more particularly, to a method for fabricating a semiconductor device and the semiconductor device.

BACKGROUND

As a semiconductor memory device commonly used in computers, dynamic random access memory (DRAM) includes many repeated memory cells. Each memory cell generally includes a capacitor and a transistor. At present, in a stacked capacitor structure used in the DRAM, the capacitor is a cylinder capacitor having a higher aspect ratio, and a fabrication process employed to form the capacitor structure will directly affect performance of the capacitor structure.

SUMMARY

On this account, embodiments of the present disclosure provide a method for fabricating a semiconductor device and the semiconductor device.

According to a first aspect of the embodiments of the present disclosure, there is provided a method for fabricating a semiconductor device, comprising: providing a semiconductor substrate, the substrate having a first region and a second region; forming an initial mask layer on an upper surface of the substrate; patterning the initial mask layer, forming a first pattern mask having a first height on the first region, and forming a second pattern mask having a second height on the second region, a pattern density of the first pattern mask being greater than a pattern density of the second pattern mask, and the first height being greater than the second height; and etching the substrate based on the first pattern mask and the second pattern mask, transferring a pattern of the first pattern mask to the first region, and transferring a pattern of the second pattern mask to the second region.

According to a second aspect of the embodiments of the present disclosure, a semiconductor device is provided, where the semiconductor device is fabricated by means of the method for fabricating the semiconductor device, and the semiconductor device at least comprises a base substrate and a capacitor structure.

BRIEF DESCRIPTION OF THE DRAWINGS

In accompanying drawings (may be not drawn to scale), similar reference numerals may describe similar parts in different views. Similar reference numerals having different letter suffixes may denote different examples of similar parts. The accompanying drawings roughly show various embodiments discussed herein by way of examples instead of restriction manners.

Figure 1A:
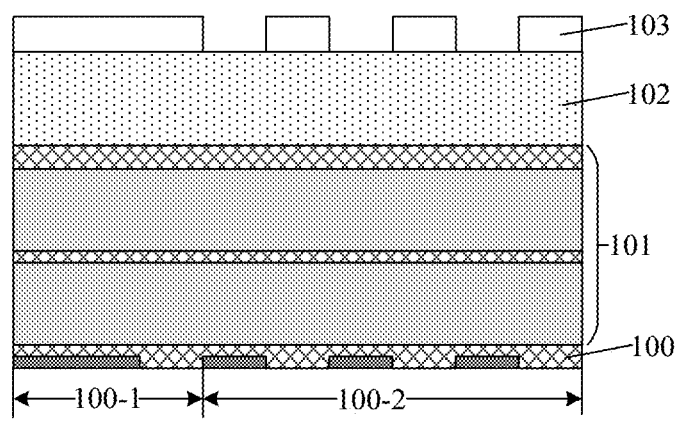
FIGS. 1a to 1c are schematic structural diagrams showing processes of forming a semiconductor device according to one embodiment of the present disclosure.

Reference numerals in the accompanying drawings:
100/200-base substrate; 101/201-stack structure; 101-1/B-peripheral region; 100-2/A-array region; 101a-capacitor pattern; 102-first hard mask layer; 103-second hard mask layer; 102a-first hard mask layer after first etching; 102b-first hard mask layer after second etching; 200a-contact structure; 200b-insulating layer; 201a-first sacrificial layer; 201b/213-first support layer; 201c-second sacrificial layer; 201d/214-second support layer; 202-second initial mask layer; 202a-first pattern mask; 202b-second pattern mask; 203a-first initial mask; 204-intermediate dielectric layer; 204a-partial intermediate dielectric layer; 205-second mask layer; 205a-dielectric anti-reflective coating; 205b-bottom anti-reflective coating; 205c-photoresist layer; 206c-photoresist layer patterned; 206b-bottom anti-reflective coating patterned; 206a-dielectric anti-reflective coating patterned; 207-capacitor hole; 208-etching pillar; 209-first electrode layer; 210-dielectric layer; 211-second electrode layer; 212-conductive material; 40-semiconductor devices; D-first opening; and E-second opening.

DETAILED DESCRIPTION

Exemplary embodiments of the present disclosure will be described in detail below with reference to the accompanying drawings. Although the exemplary embodiments of the present disclosure are illustrated in the accompanying drawings, it should be understood that the present disclosure may be embodied in various forms and should not be limited by the embodiments set forth herein. Rather, these embodiments are provided such that the present disclosure can be understood thoroughly and the scope of the present disclosure can be fully conveyed to those skilled in the art.

In the following description, numerous details are given to provide a more thorough understanding of the present disclosure. However it will be apparent to those skilled in the art that the present disclosure may be practiced without one or more of these details. In other examples, some technical features well known in the art are not described so as not to obscure the present disclosure. That is, all features of the actual embodiments are not described herein and well-known functions and structures are not described in detail.

In the drawings, dimensions of layers, regions and elements and relative dimensions thereof may be exaggerated for clarity. Throughout, the same reference numerals denote the same elements.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers and/or sections, these elements, components, regions, layers and/or sections should not be limited by these terms. These terms are only employed to distinguish one element, component, region, layer or section from another element, component, region, layer or section. Therefore, without departing from the teachings of the present disclosure, a first element, component, region, layer or section discussed below may be represented as a second element, component, region, layer or section. Whereas the discussion of the second element, component, region, layer or section does not imply that the first element, component, region, layer or section is necessarily present in the present disclosure.

The terminology used herein is for the purpose of describing some embodiments only and is not intended to limit the present disclosure. As used herein, the singular forms of "a", "one" and "said/the" are also intended to include plural forms, unless the context clearly indicates otherwise. It should also be understood that the terms "comprising" and/or "including", when used in this specification, determine the presence of the described features, integers, steps, operations, elements and/or components, but do not preclude the presence or addition of one or more other features, integers, steps, operations, elements, components, and/or groups thereof. As used herein, the term "and/or" includes any and all combinations of related listed items.

Before the method for forming the semiconductor device provided by the embodiments of the present disclosure is introduced in detail, processes of forming the semiconductor device in the related technologies are first described.

Figure 1B:
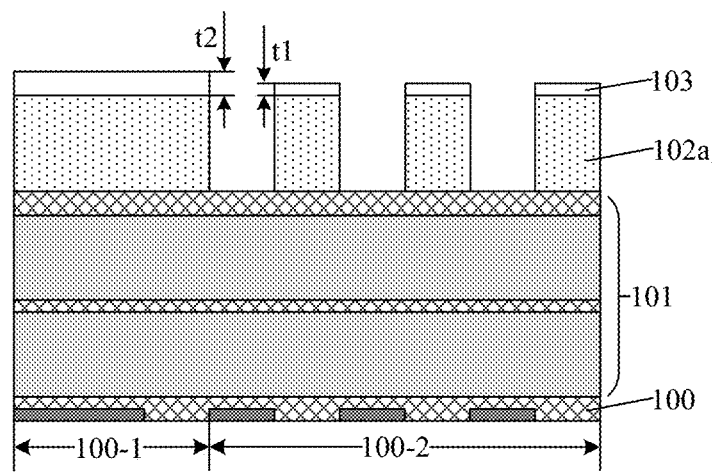
Figure 1C:
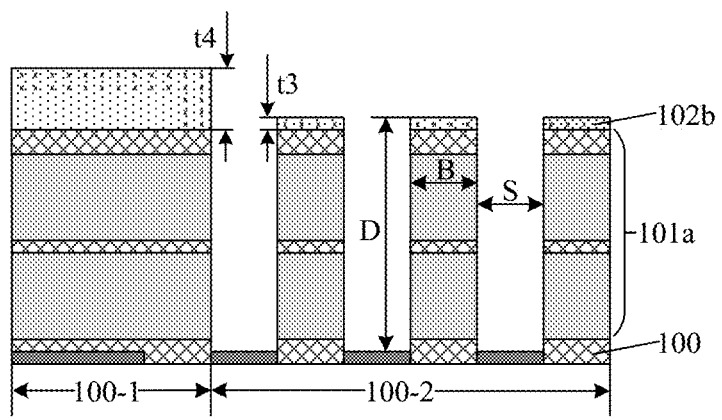

FIGS. 1a to 1c are schematic structural diagrams showing processes of forming a semiconductor device according to one embodiment of the present disclosure. As shown in FIG. 1a, a stack structure 101 is formed on a surface of a base substrate 100, and a first hard mask layer 102 and a second hard mask layer 103 are formed on a surface of the stack structure 101, where the second hard mask layer 103 has patterns in which capacitor holes are formed. The base substrate 100 includes a peripheral region 100-1 and an array region 100-2, where a pattern density of a capacitor hole pattern in the second hard mask layer on the array region 100-2 is greater than that of a capacitor hole pattern in the second hard mask layer on the peripheral region 100-1.

The formation process of the semiconductor device includes two pattern transfer processes. In the first pattern transfer process, the first hard mask layer is etched by means of the second hard mask layer to transfer the capacitor hole pattern in the second hard mask layer into the first hard mask layer. As shown in FIG. 1B, a first hard mask layer 102a after the first etching is obtained by means of the first pattern transfer. During the first pattern transfer process, a thickness t1 of the second hard mask layer positioned on the array region 100-2 is less than a thickness t2 of the second hard mask layer positioned on the peripheral region 100-1 due to an etching load effect.

In the second pattern transfer process, the stack structure is etched by means of the first hard mask layer etched, to transfer the capacitor hole pattern into the stack structure 101; and the second hard mask layer 103 needs to be removed before the second pattern transfer is performed. As shown in FIG. 1c, a capacitor pattern 101a and a first hard mask layer 102b after the second etching are formed in the second pattern transfer process, where the capacitor pattern 101a has a top dimension B and a height D, and a distance between two adjacent capacitor patterns is S.

After the capacitor hole pattern is transferred into the stack structure, the first hard mask layer 102b after the second etching also needs to be removed.

Because the pattern density of the capacitor hole pattern in the first hard mask layer on the array region 100-2 is greater than that of the capacitor hole pattern in the first hard mask layer on the peripheral region 100-1, in the first pattern transfer process and the second pattern transfer process, due to the etching load effect, a thickness t3 of the first hard mask layer positioned on the array region 100-2 is less than a thickness t4 of the first hard mask layer positioned on the peripheral region 100-1, and the first hard mask layer on the array region 100-2 and the first hard mask layer positioned on the peripheral region 100-1 have different roughness, which may even damage the stack structure 101 below the first mask layer 102b, and thus adversely affect the performance of the semiconductor device.

Figure 2:
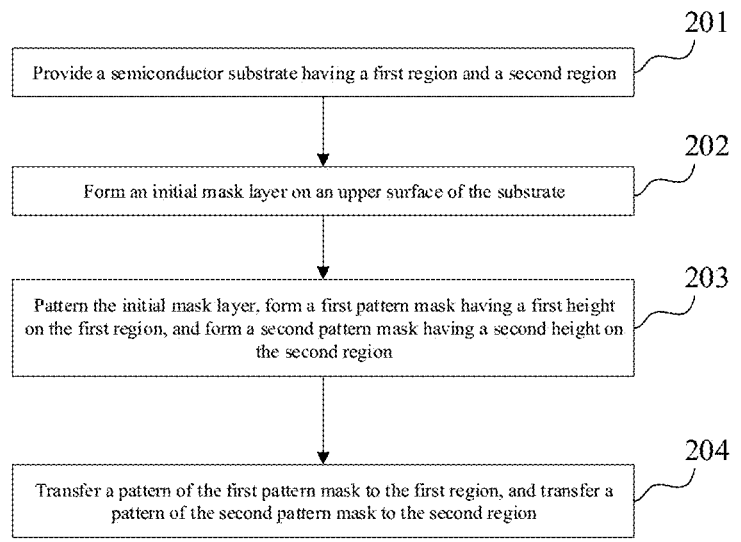
FIG. 2 is a schematic flow diagram of a method for fabricating a semiconductor device according to another embodiment of the present disclosure.

FIG. 2 is a schematic flow diagram of a method for fabricating a semiconductor device according to another embodiment of the present disclosure. As shown in FIG. 2, the method includes following steps.

Step 201: providing a semiconductor substrate having a first region and a second region.

Figure 3A:
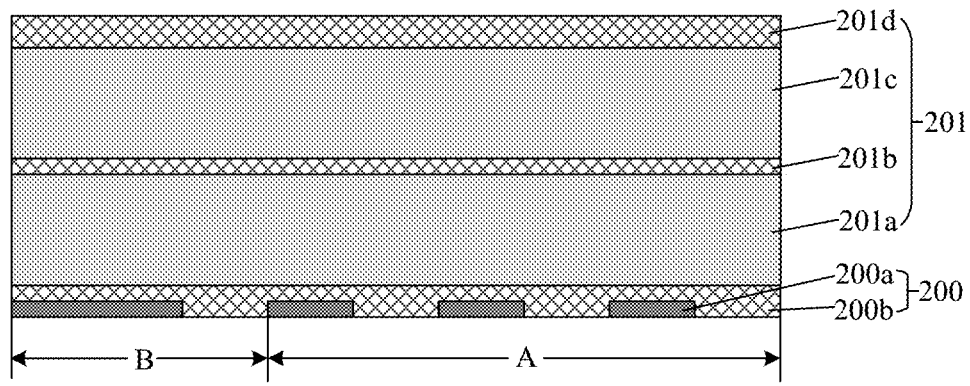
FIGS. 3a to 3q are schematic structural diagrams showing processes of fabricating a semiconductor device according to one embodiment of the present disclosure.

As shown in FIG. 3a, in some embodiments, the substrate includes a base substrate 200 and a stack structure 201 on the base substrate 200.

The stack structure 201 is configured to form a capacitor structure, and includes a first sacrificial layer 201a, a first support layer 201b, a second sacrificial layer 201c and a second support layer 201d stacked in sequence from bottom to top. The first sacrificial layer 201a and the second sacrificial layer 201c may be an oxide layer such as a silicon oxide layer. The first support layer 201b and the second support layer 201d may be silicon nitride layers.

In some embodiments, the base substrate includes an array region A and a peripheral region B, where the array region A is configured to form a memory device of a semiconductor memory cell, such as a memory capacitor, and the peripheral region B is configured to form a peripheral control circuit. Further, the first region is the memory array region A, and the second region is the peripheral circuit region B.

It should be noted that, the solutions of the present disclosure are not limited to the array region and the peripheral region, and the solutions of the present disclosure are applicable to patterning processes having different pattern densities.

In the embodiments of the present disclosure, a contact structure 200a and an insulating layer 200b covering the contact structure 200a are formed in the base substrate 200. The contact structure 200a is configured to electrically connect the capacitor structure formed. A material of the contact structure 200a may be any conductive material, such as tungsten (W), cobalt (Co), copper (Cu), aluminum (Al), polysilicon, doped silicon, silicide, or any combination thereof.

Step 202: forming an initial mask layer on an upper surface of the substrate.

In the embodiments of the present disclosure, the initial mask layer may be any hard mask layer, for example, a polysilicon layer, a silicon nitride layer, or a spin-on carbon layer.

In some embodiments, the initial mask layer includes a second initial mask layer 202 and a first initial mask layer 203a stacked in sequence from bottom to top. The first initial mask layer 203a is an oxide material, and the second initial mask layer 202 is a polysilicon material.

Step 203: patterning the initial mask layer, forming a first pattern mask having a first height on the first region, and forming a second pattern mask having a second height on the second region, where a pattern density of the first pattern mask is greater than a pattern density of the second pattern mask, and the first height is greater than the second height.

In some embodiments, the first pattern mask may be a capacitor hole pattern or other patterns.

There are two patterning processes for the initial mask layer. In the first patterning process, the first pattern mask and the second pattern mask are formed first, and then part of the second pattern mask is removed. In the second patterning process, part of the initial mask layer on the second region is removed before the initial mask layer is not patterned, and then the first pattern mask and the second pattern mask are formed.

In some embodiments, when the first patterning process is used, the Step 203 of patterning the initial mask layer includes following steps.

Step 2031: providing a first pattern mask, forming the first pattern mask in the initial mask layer on the first region, and forming the second pattern mask in the initial mask layer on the second region, where the pattern density of the first pattern mask is greater than the pattern density of the second pattern mask.

In some embodiments, the Step 2031 may include following steps.

Figure 3B:
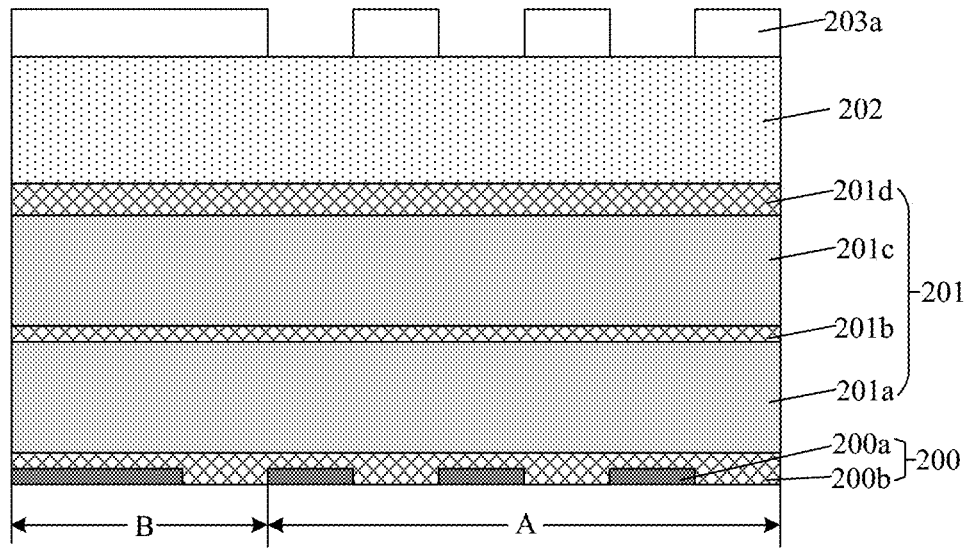

As shown in FIG. 3b, the first initial mask layer is patterned based on the first pattern mask to form a first initial mask 203a.

Figure 3C:
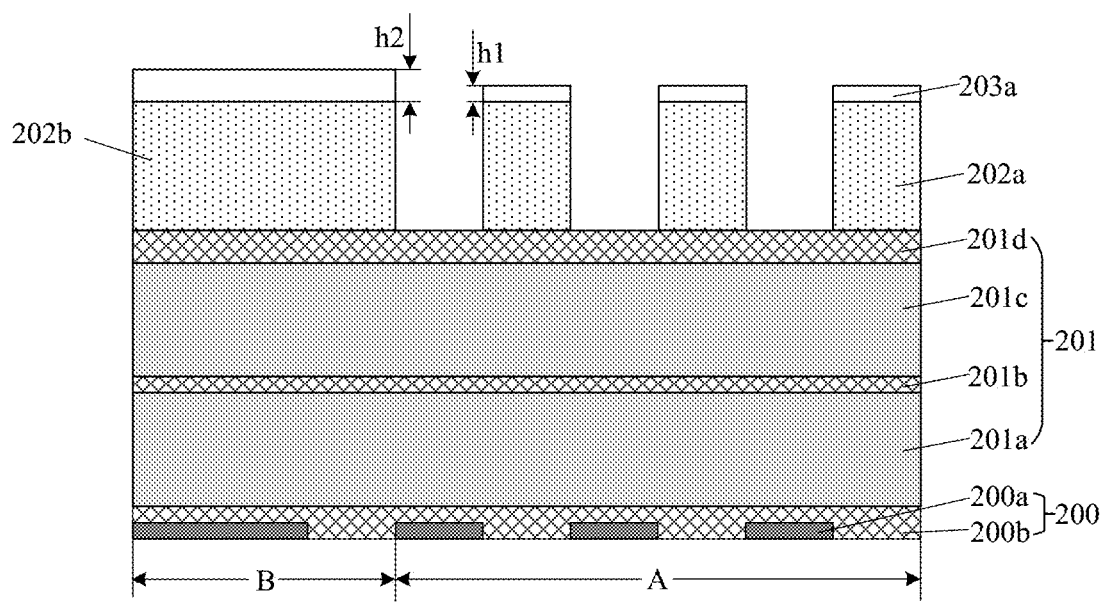

As shown in FIG. 3c, the second initial mask layer 202 is etched based on the first initial mask 203a, to form the first pattern mask 202a and the second pattern mask 202b.

Figure 3D:
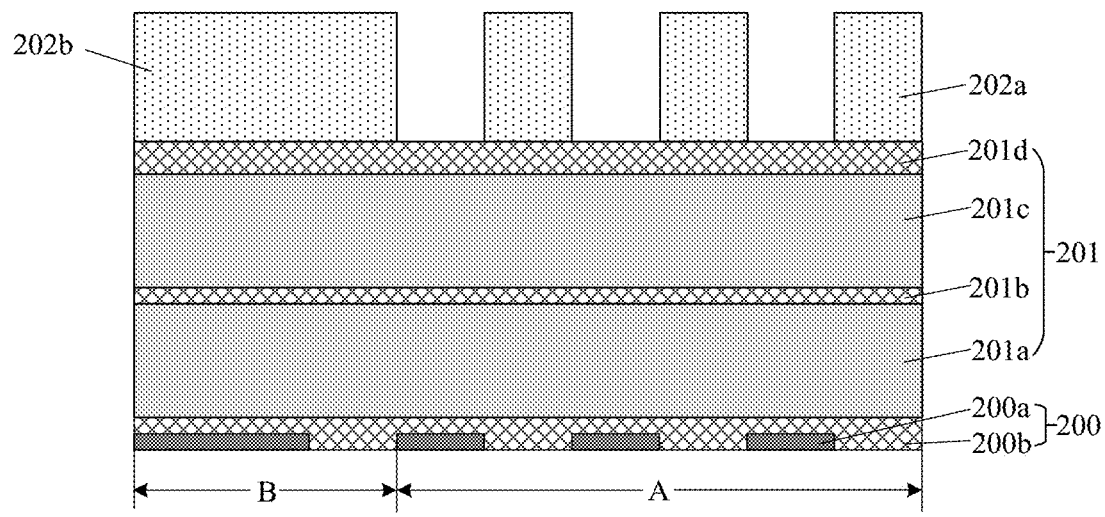

As shown in FIG. 3d, the first initial mask 203a is removed.

It should be noted that, in the process of etching the second initial mask layer 202 by means of the first initial mask 203a, due to the etching load effect caused by the different pattern densities of the patterns on the array region A and the peripheral region B, a residual thickness h1 of the first initial mask 203a on the array region A is less than a residual thickness h2 of the first initial mask 203a on the peripheral region B.

Step 2032: partially etching the second pattern mask 202b, such that a height of the second pattern mask 202b is less than that of the first pattern mask 202a.

In some embodiments, the Step 2032 of partially etching the second pattern mask 202b includes following steps.

Figure 3E:
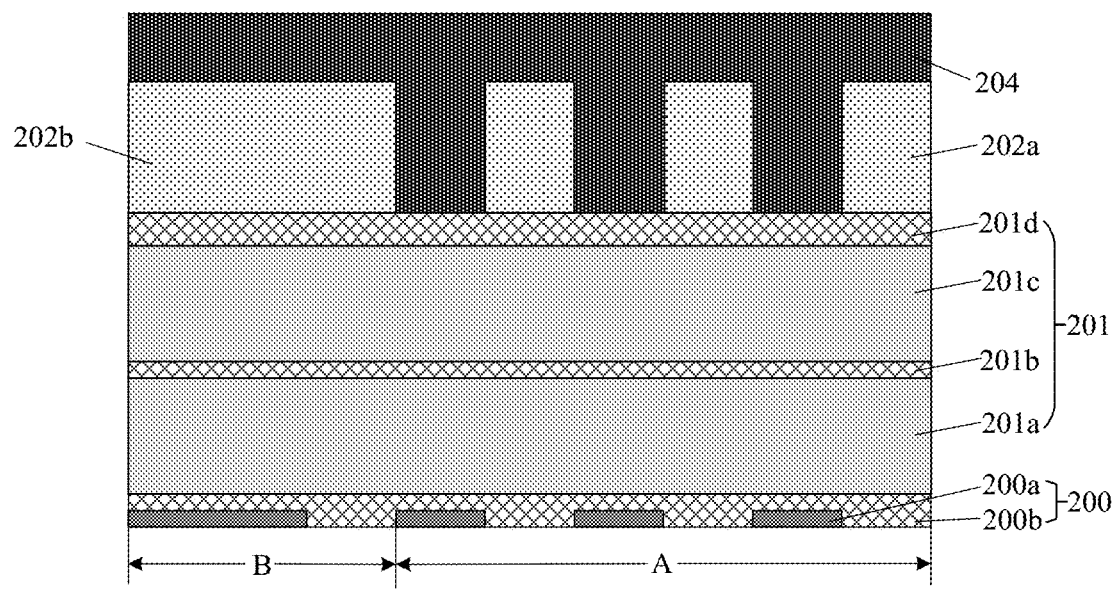

As shown in FIG. 3e, an intermediate dielectric material is deposited to form an intermediate dielectric layer 204 filling the first pattern mask 202a and the second pattern mask 202b.

In the embodiments of the present disclosure, the intermediate dielectric layer 204 may be a spin-on hard mask (SOH) layer, a spin-on carbon layer, or other hard mask layer; The intermediate dielectric layer 204 may be formed by means of any suitable deposition process.

Figure 3F:
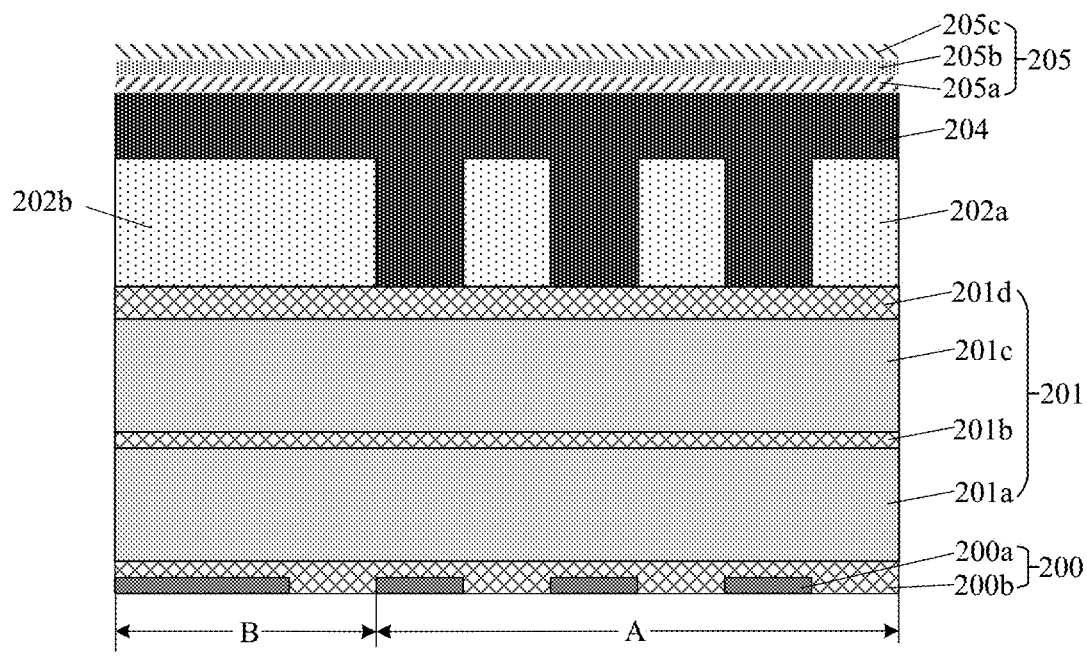

As shown in FIG. 3f, a second mask layer 205 is formed on the intermediate dielectric layer 204, where the second mask layer 205 includes a dielectric anti-reflective coating 205a, a bottom anti-reflective coating 205b and a photoresist layer 205c stacked sequentially from bottom to top. In the embodiments of the present disclosure, the dielectric anti-reflective coating 205a, the bottom anti-reflective coating 205b and the photoresist layer 205c may be formed by means of any suitable deposition process.

Figure 3G:
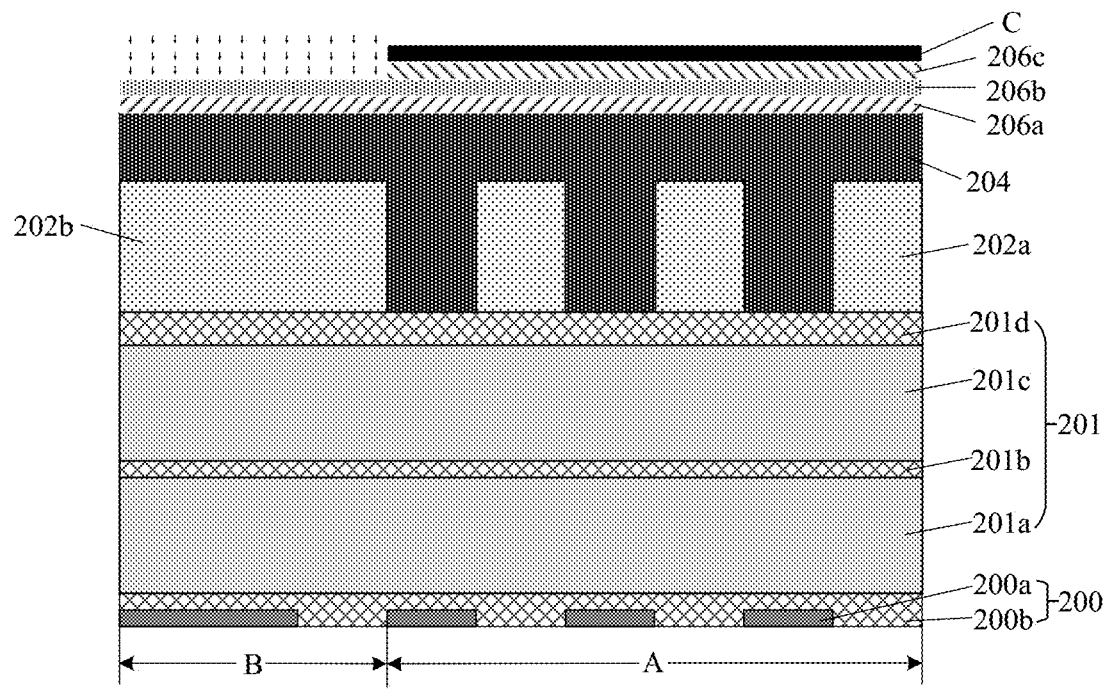

As shown in FIG. 3g, a second pattern mask is provided, and a mask pattern exposing the second pattern mask is formed in the intermediate dielectric layer on the second region.

In the embodiments of the present disclosure, the photoresist layer 205c on the peripheral region B is exposed by means of a preset second pattern mask C to obtain a photoresist layer 206c patterned, and layer structures on the peripheral region B are exposed.

Figure 3H:
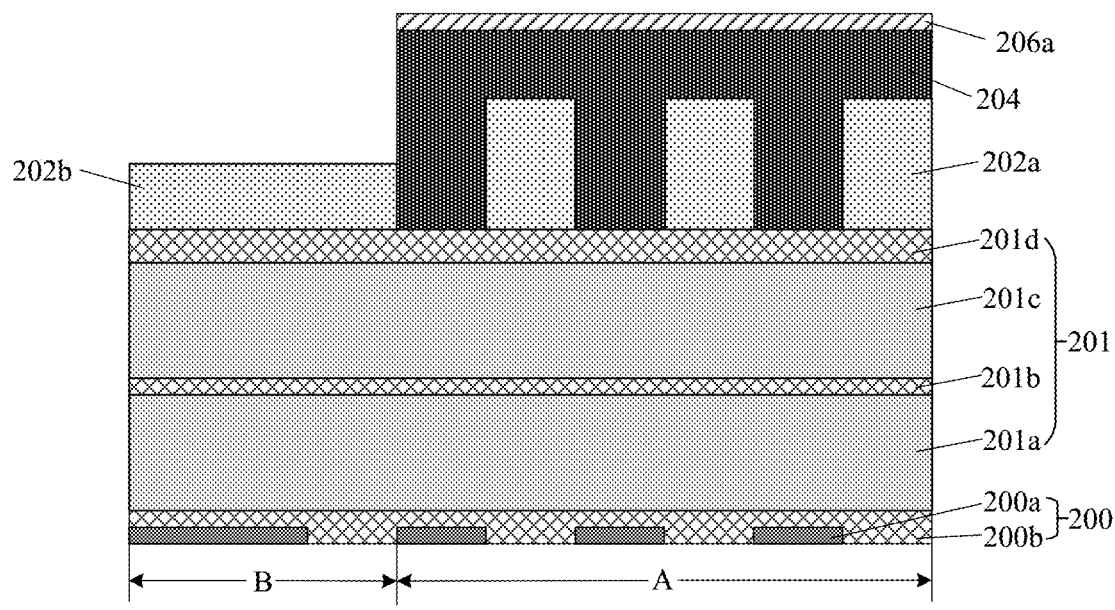

As shown in FIG. 3h, a part of the second pattern mask 202b is etched away based on the mask pattern.

In the embodiments of the present disclosure, a bottom anti-reflective coating 206b, a dielectric anti-reflective coating 206a, the intermediate dielectric layer 204 and a part of the second initial mask layer 202 above the peripheral region B are sequentially removed by etching downwards based on the photoresist layer 206c patterned. Next, the photoresist layer 206c and the bottom anti-reflective coating 206b above the array region A are removed. That is, only the dielectric anti-reflective coating 206a and the intermediate dielectric layer 204 are remained above the array region A.

Figure 3I:
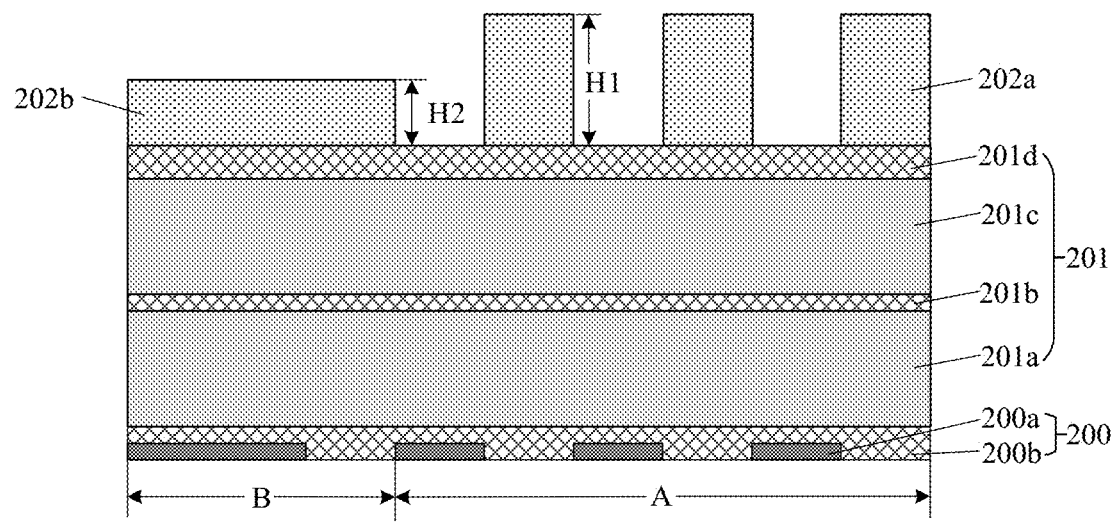

As shown in FIG. 3i, the intermediate dielectric layer 204 is removed.

In the embodiments of the present disclosure, the dielectric anti-reflective coating 206a and the intermediate dielectric layer 204 remained above the array region A need to be removed, such that the first pattern mask 202a and the second pattern mask 202b are exposed. In this case, a height H1 of the first pattern mask 202a is greater than a height H2 of the second pattern mask 202b.

The height H1 of the first pattern mask 202a positioned on the array region A is greater than the height H2 of the second pattern mask 202b positioned on the peripheral region B, which may balance the etching load effect caused by different pattern densities during the etching process, such that the etching pillar is not damaged when the remaining first pattern mask 202a is removed by subsequent etching, and thus no adverse effect is caused to capacitance of the capacitor structure formed.

In some embodiments, when the second patterning process is used, the Step 203 of patterning the initial mask layer includes following steps.

Figure 3J:
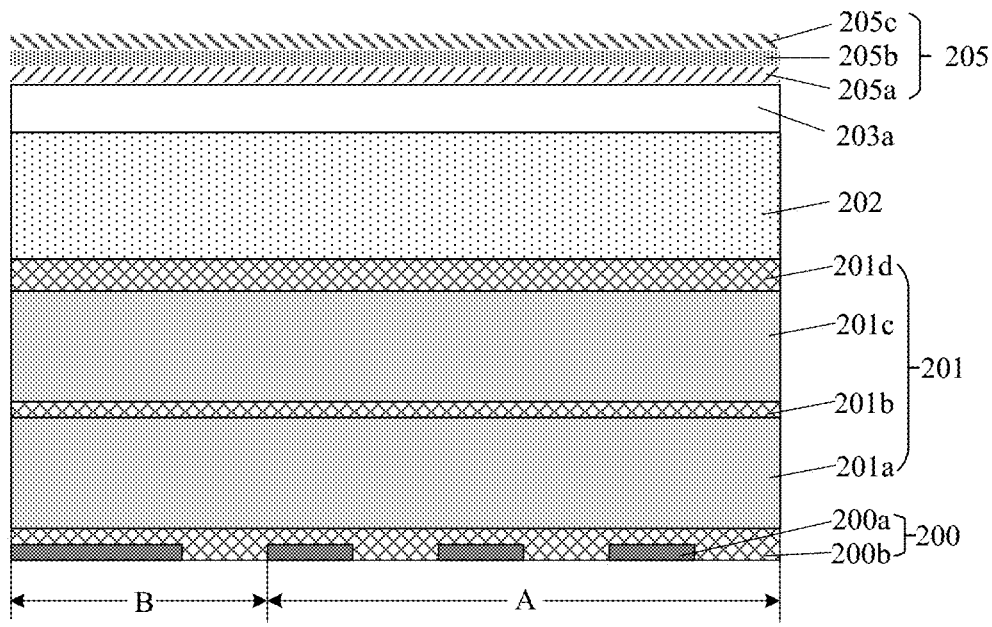
Figure 3K:
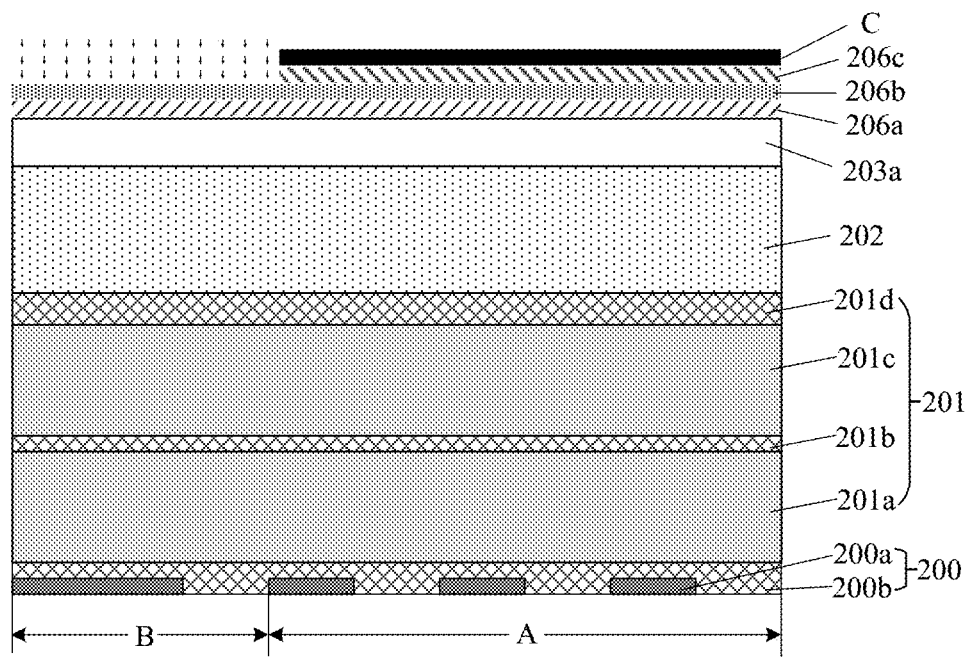

As shown in FIG. 3j FIG. 3k, a third pattern mask is provided, and a mask pattern exposing the initial mask layer of the second region is formed on the initial mask layer.

Figure 3L:
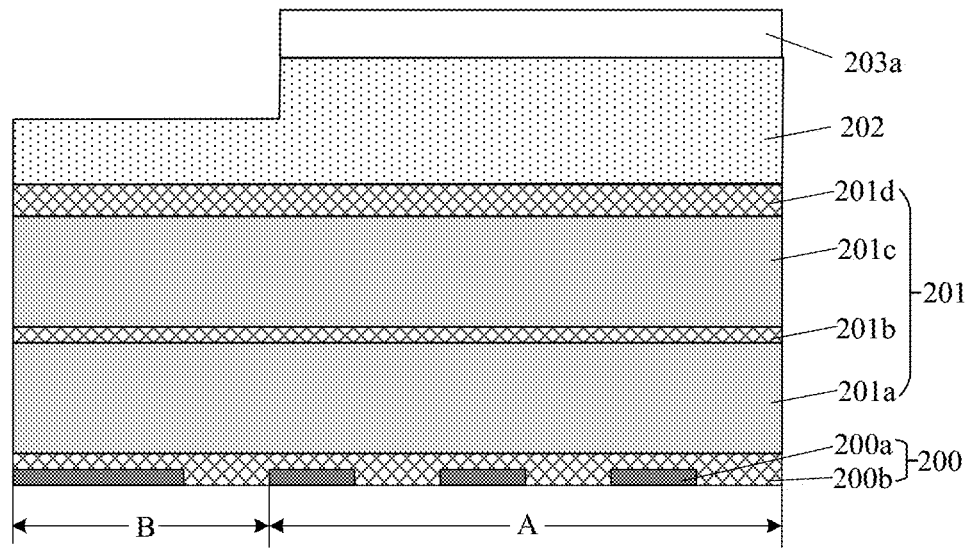

As shown in FIG. 3l, the initial mask layer is partially etched based on the mask pattern, such that a height of the initial mask layer of the second region is smaller than that of the initial mask layer of the first region.

Figure 3M:
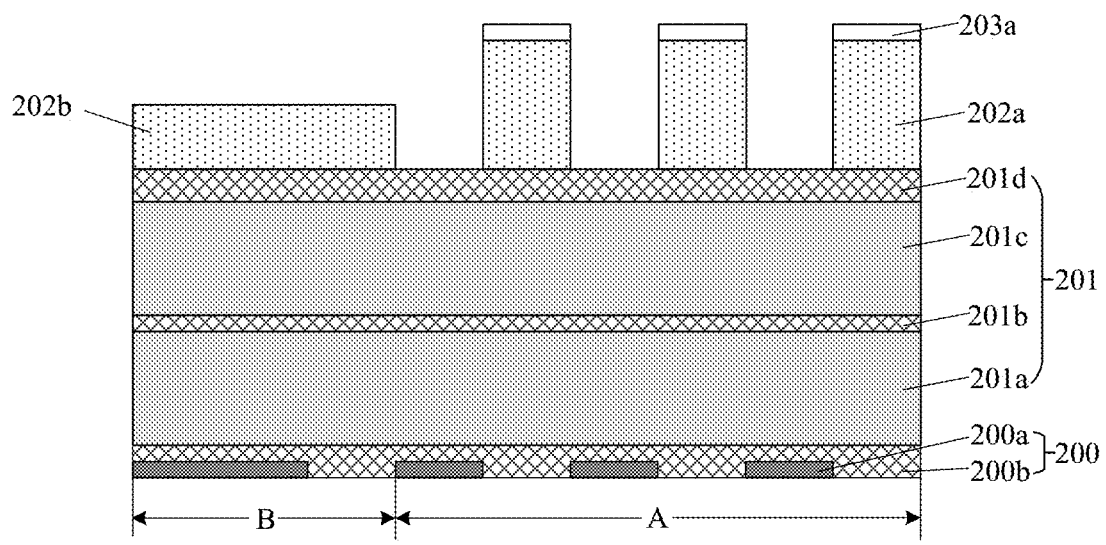

As shown in FIG. 3m, a fourth pattern mask is provided, the first pattern mask is formed in the initial mask layer of the first region, and the second pattern mask is formed in the initial mask layer of the second region, where the pattern density of the first pattern mask is greater than the pattern density of the second pattern mask.

It should be noted that, the first pattern mask used in the first patterning process is the same as the fourth pattern mask used in the second patterning process, where the second pattern mask is the same as the third pattern mask. Moreover, neither the second pattern mask nor the third pattern mask is additional pattern mask. Instead, they are the pattern masks used in the previous fabrication process. That is, it is not required to provide additional pattern masks, where the pattern masks herein may be photomasks.

Step 204: etching the substrate based on the first pattern mask and the second pattern mask, transferring a pattern of the first pattern mask to the first region, and transferring a pattern of the second pattern mask to the second region.

In some embodiments, the first pattern mask 202a is a capacitor hole pattern, and the contact structure 200a corresponding to the capacitor hole pattern is formed in the base substrate 200.

In the embodiments of the present disclosure, Step S204 may include: etching the second support layer, the second sacrificial layer, the first support layer and the first sacrificial layer in sequence based on the first pattern mask, to transfer the capacitor hole pattern into the stack structure, and forming, in the stack structure, a plurality of capacitor holes and an etching pillar between the plurality of capacitor holes. The capacitor holes expose part of the contact structure.

Figure 3N:
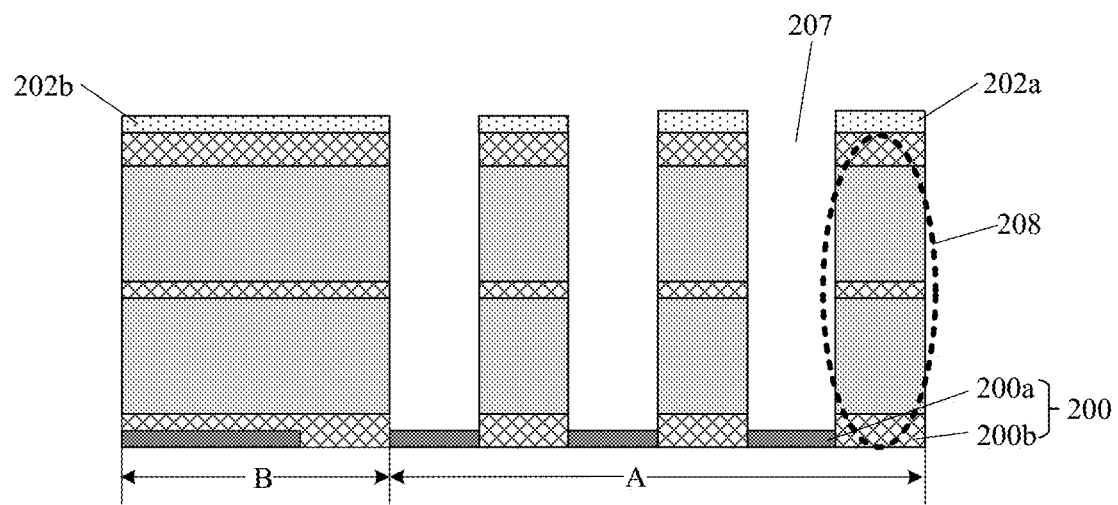

As shown in FIG. 3i and FIG. 3n, based on the first pattern mask 202a, the second support layer 201d, the second sacrificial layer 201c, the first support layer 201b, the first sacrificial layer 201a and part of the insulating layer 200b are sequentially etched to form a plurality of capacitor holes 207 and an etching pillar 208 between adjacent two of the plurality of capacitor holes. Each capacitor hole 207 exposes one corresponding contact structure 200a.

In some embodiments, after the capacitor holes are formed, the method for fabricating the semiconductor device further includes: removing the first pattern mask 202a.

Figure 3O:
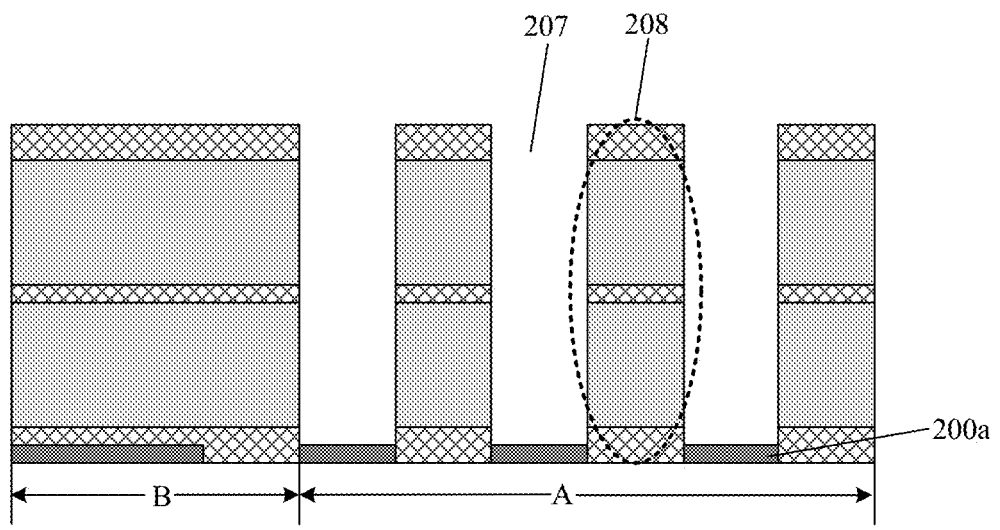

As shown in FIG. 3o, after the capacitor holes 207 are formed, the first pattern mask 202a remained on the array region A and the second pattern mask 202b remained on the peripheral region B are removed by means of a dry etching process, such that a top surface of the etching pillar 208 is exposed.

In the embodiments of the present disclosure, the height H1 of the first pattern mask 202a positioned on the array region A is greater than the height H2 of the second pattern mask 202b positioned on the peripheral region B, which may balance the etching load effect caused by different pattern densities during the etching process, such that the etching pillar is not damaged when the remaining first pattern mask 202a is removed by subsequent etching, and thus no adverse effect is caused to the capacitor structure formed, thereby reducing sources of defects.

In some embodiments, after the first pattern mask 202a is removed, the method for fabricating the semiconductor device further includes: processing the etching pillar to form the capacitor structure.

In some embodiments, the processing the etching pillar to form the capacitor structure includes following steps.

Step S20: forming a first electrode layer on an inner wall of each of the plurality of capacitor holes and a surface of the etching pillar respectively.

The first electrode layer may be a titanium nitride layer.

Step S21: forming a first opening in the second support layer.

Step S22: removing the second sacrificial layer by means of the first opening.

Step S23: forming a second opening in the first support layer.

Step S24: removing the first sacrificial layer by means of the second opening

Figure 3P:
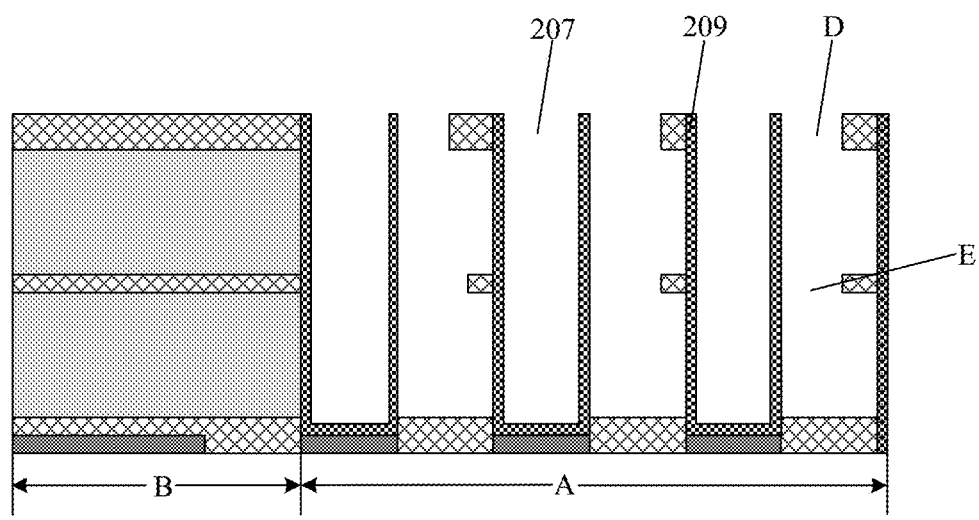

As shown in FIG. 3p, a first electrode layer 209 is formed on the inner wall of the capacitor hole 207 and the surface of the etching pillar; a first opening D is formed in the second support layer, and the second sacrificial layer is removed through the first opening D; and a second opening E is formed in the first support layer, and the first sacrificial layer is removed through the second opening E.

In the embodiments of the present disclosure, the first opening D and the second opening E may be formed by means of a dry etching technique such as a plasma etching technique.

In the embodiments of the present disclosure, the second sacrificial layer and the first sacrificial layer may be removed by means of a wet etching technique, for example, by using an etching solution such as sulfuric acid, hydrofluoric acid, and nitric acid.

Step S25: sequentially depositing a dielectric layer and a second electrode layer on a surface of the first electrode layer to form the capacitor structure.

Figure 3Q:
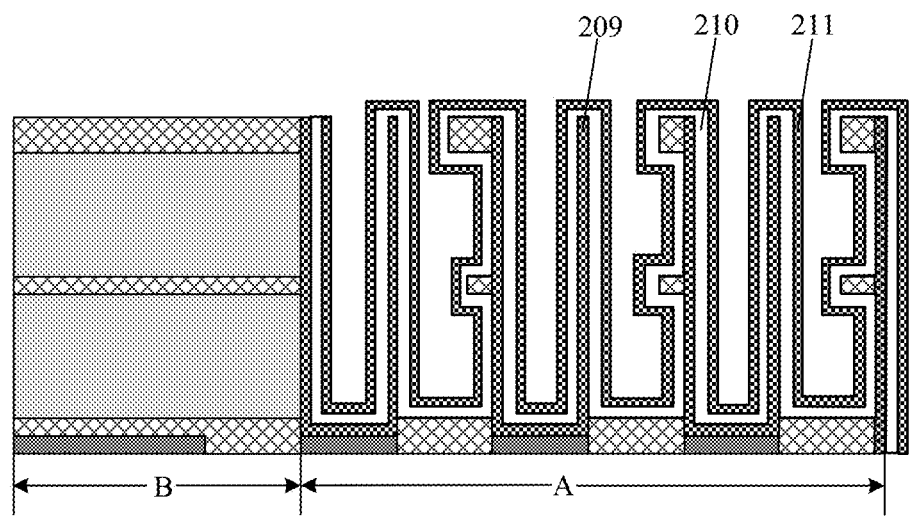

As shown in FIG. 3q, a dielectric layer 210 and a second electrode layer 211 are formed on the surface of the first electrode layer 209. In the embodiments of the present disclosure, the dielectric layer 210 may be a zirconia layer and/or an alumina layer, or may be other high dielectric constant material layer. The second electrode layer 211 may be the same as or different from the first electrode layer 209.

In some embodiments, the method of forming the semiconductor device further includes: depositing a conductive material between the second electrode layers. The conductive material may be polysilicon or any other suitable conductive material such as tungsten, cobalt, or doped polysilicon.

According to the method for fabricating the semiconductor device provided by the embodiments of the present disclosure, different mask thicknesses are formed in regions where the masks have different pattern densities, to balance the etching load effect brought by the different pattern densities in an etching process, improve etching stability of the high aspect ratio structure, and reduce the sources of the defects, thereby improving integrity and stability of the capacitor pattern, and improving performance of the semiconductor device.

Figure 4:
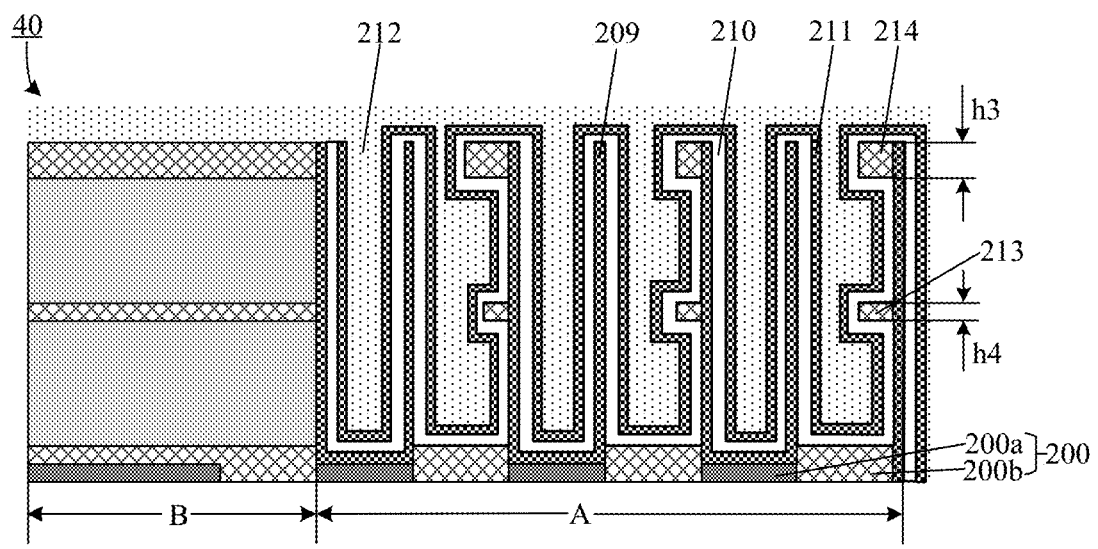
FIG. 4 is a cross-sectional view of a semiconductor device according to one embodiment of the present disclosure.

In addition, the embodiments of the present disclosure also provide a semiconductor device, which is fabricated by means of the method for fabricating the semiconductor device provided in the above embodiments. FIG. 4 is a cross-sectional view of a semiconductor device according to one embodiment of the present disclosure. As shown in FIG. 4, the semiconductor device 40 includes a base substrate 200 and a capacitor structure, where the base substrate 200 includes a contact structure 200a and an insulating layer covering the contact structure 200a, and the contact structure 200a is configured to electrically connect the capacitor structure formed.

In the embodiments of the present disclosure, the base substrate 200 includes an array region A and a peripheral region B, and the capacitor structure is positioned on the surface of the array region A of the base substrate 200.

With continued reference to FIG. 4 the capacitor structure includes a first electrode layer 209, a dielectric layer 210 and a second electrode layer 211 stacked in sequence, and a conductive material 212 is filled between adjacent second electrode layers 211.

In the embodiments of the present disclosure, the capacitor structure has a cup-shaped structure, and the capacitor structure further includes a first support layer 213 and a second support layer 214 arranged in parallel. The first support layer 213 is provided at a middle periphery of the capacitor structure, the second support layer 214 is provided at a top periphery of the capacitor structure, and the first support layer 213 and the second support layer 214 are jointly configured to support the capacitor structure.

In some embodiments, the thickness h3 of the second support layer 214 is greater than the thickness h4 of the first support layer 213, such that a better support effect can be achieved.

The method for fabricating the semiconductor device in this embodiment of the present disclosure is similar to the method for fabricating the semiconductor device in the above-mentioned embodiments. Therefore, reference is made to the above-mentioned embodiments for technical features not disclosed in detail in this embodiment of the present disclosure, and detailed descriptions thereof are omitted here.

According to the semiconductor device provided by the embodiments of the present disclosure, the etching load effect brought by the different pattern densities in an etching process is balanced by different mask thicknesses to improve the etching stability of the high aspect ratio structure, and reduce the sources of the defects, thereby improving integrity and stability of the capacitor pattern, and improving the performance of the semiconductor device.

From several embodiments provided in the present disclosure, it should be understood that the disclosed apparatus and method may be implemented by means of non-objected manners. The apparatus embodiments described above are merely exemplary. For example, the unit partition is merely a logic functional partition. In actual implementation, additional manners of partitioning may be available. For another example, a plurality of units or components may be combined or integrated into another system, or some features may be ignored or not executed. In addition, the displayed or discussed mutual couplings or direct couplings between constituent parts may be implemented by using some interfaces.

The units described as separate components may or may not be physically separate, and components displayed as units may or may not be physical units, may be positioned in one position, or may be distributed on a plurality of network units. Some or all of the units may be selected according to actual needs to achieve the objectives of the solutions of this embodiment.

The features disclosed in several methods or apparatus embodiments provided in the present disclosure may be arbitrarily combined without conflict to obtain new method embodiments or apparatus embodiments.

The above-mentioned embodiments are merely some embodiments of the present disclosure, but the protection scope of the embodiments of the present disclosure is not limited thereto. Any variation or substitution easily conceivable to a person of ordinary skills in the art within the technical scope disclosed in the embodiments of the present disclosure shall fall within the protection scope of the embodiments of the present disclosure. Therefore, the protection scope of the embodiments of the present disclosure shall be subject to the protection scope of the claims.

What is claimed is:

1. A method for fabricating a semiconductor device, comprising:
providing a semiconductor substrate having a first region and a second region;
forming an initial mask layer on an upper surface of the substrate;
providing a first pattern mask, forming the first pattern mask in the initial mask layer on the first region, and forming the second pattern mask in the initial mask layer on the second region, the pattern density of the first pattern mask being greater than the pattern density of the second pattern mask;
partially etching the second pattern mask, such that a height of the second pattern mask is less than a height of the first pattern mask; and
etching the substrate based on the first pattern mask and the second pattern mask, transferring a pattern of the first pattern mask to the first region, and transferring a pattern of the second pattern mask to the second region.

2. The method according to claim 1, wherein the first region is a memory array region, and the second region is a peripheral circuit region.

3. The method according to claim 1, wherein the initial mask layer comprises a second initial mask layer and a first initial mask layer stacked sequentially from bottom to top; and
the forming the first pattern mask in the initial mask layer on the first region, and forming the second pattern mask in the initial mask layer on the second region comprises:
patterning the first initial mask layer based on the first pattern mask to form a first initial mask;
etching the second initial mask layer based on the first initial mask to form the first pattern mask and the second pattern mask; and
removing the first initial mask.

4. The method according to claim 1, wherein the partially etching the second pattern mask comprises:
depositing an intermediate dielectric material to form an intermediate dielectric layer filling the first pattern mask and the second pattern mask;
providing a second pattern mask, and forming a mask pattern exposing the second pattern mask in the intermediate dielectric layer on the second region;
etching and removing part of the second pattern mask based on the mask pattern; and
removing the intermediate dielectric layer.

5. The method according to claim 1, wherein the patterning the initial mask layer comprises:
providing a third pattern mask, and forming, on the initial mask layer, a mask pattern exposing the initial mask layer of the second region;
partially etching the initial mask layer based on the mask pattern, such that a height of the initial mask layer of the second region is smaller than a height of the initial mask layer of the first region; and
providing a fourth pattern mask, forming the first pattern mask in the initial mask layer of the first region, and forming the second pattern mask in the initial mask layer of the second region, the pattern density of the first pattern mask being greater than the pattern density of the second pattern mask.

6. The method according to claim 1, wherein the substrate comprises a base substrate and a stack structure on the base substrate;
wherein the stack structure comprises a first sacrificial layer, a first support layer, a second sacrificial layer and a second support layer stacked in sequence from bottom to top.

7. The method according to claim 6, wherein the first pattern mask is a capacitor hole pattern, and a contact structure corresponding to the capacitor hole pattern is formed in the base substrate.

8. The method according to claim 7, wherein the etching the substrate based on the first pattern mask and the second pattern mask, and transferring the pattern of the first pattern mask to the first region comprises:

etching the second support layer, the second sacrificial layer, the first support layer and the first sacrificial layer in sequence based on the first pattern mask, to transfer the capacitor hole pattern into the stack structure, and forming, in the stack structure, a plurality of capacitor holes and an etching pillar between adjacent two of the plurality of capacitor holes;

wherein the plurality of capacitor holes expose part of the contact structure.

9. The method according to claim 8, further comprising:
removing the first pattern mask after the plurality of capacitor holes are formed.

10. The method according to claim 9, further comprising:
processing the etching pillar to form a capacitor structure.

11. The method according to claim 10, wherein the processing the etching pillar to form the capacitor structure comprises:

forming a first electrode layer on an inner wall of each of the plurality of capacitor holes and a surface of the etching pillar respectively;

forming a first opening in the second support layer;

removing the second sacrificial layer by means of the first opening;

forming a second opening in the first support layer;

removing the first sacrificial layer by means of the second opening; and sequentially depositing a dielectric layer and a second electrode layer on a surface of the first electrode layer to form the capacitor structure.

* * * * *